(12) United States Patent
Keane et al.

(10) Patent No.: US 10,075,179 B1
(45) Date of Patent: Sep. 11, 2018

(54) MULTIPLE STRING, MULTIPLE OUTPUT DIGITAL TO ANALOG CONVERTER

(71) Applicant: Analog Devices Global, Hamilton (BM)

(72) Inventors: Michael D. Keane, Adare (IE); Johan H. Mansson, Puzol (ES); Dennis A. Dempsey, Newport (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/668,088

(22) Filed: Aug. 3, 2017

(51) Int. Cl.
 *H03M 1/66* (2006.01)
 *H03M 1/76* (2006.01)
 *H03M 1/70* (2006.01)

(52) U.S. Cl.
 CPC ........... *H03M 1/765* (2013.01); *H03M 1/661* (2013.01); *H03M 1/662* (2013.01); *H03M 1/70* (2013.01)

(58) Field of Classification Search
 CPC ........ H03M 1/765; H03M 1/70; H03M 1/662; H03M 1/661; H03M 1/66; H03M 1/747; H03M 1/1215; H03M 3/47; H03M 1/1225
 USPC .......................................... 341/144, 141, 118
 See application file for complete search history.

(56) References Cited

U.S. PATENT DOCUMENTS

| | | | |
|---|---|---|---|
| 3,997,892 A | 12/1976 | Susset | |
| 4,968,946 A | 11/1990 | Maier | |
| 5,138,319 A * | 8/1992 | Tesch | H03M 1/1215 341/141 |
| 5,262,779 A | 11/1993 | Sauer | |
| 5,454,946 A * | 10/1995 | Heagle | B01D 39/083 210/503 |
| 5,495,245 A | 2/1996 | Ashe | |
| 5,585,796 A | 12/1996 | Svensson | |
| 5,801,655 A * | 9/1998 | Imamura | H03M 1/687 341/136 |
| 5,969,657 A | 10/1999 | Dempsey | |
| 6,032,109 A * | 2/2000 | Ritmiller, III | G01D 3/022 702/104 |
| 6,163,289 A | 12/2000 | Ginetti | |
| 6,246,351 B1 * | 6/2001 | Yilmaz | H03M 1/0682 341/136 |
| 6,414,616 B1 * | 7/2002 | Dempsey | H03M 1/682 341/144 |
| 6,452,405 B1 | 9/2002 | Collier-Hallman | |
| 6,778,122 B2 | 8/2004 | Lien | |
| 6,907,122 B2 * | 6/2005 | Chiang | H01R 35/02 379/433.13 |

(Continued)

FOREIGN PATENT DOCUMENTS

EP   1262755 A1   12/2002

OTHER PUBLICATIONS

Kester, Walt, "Basic DAC Architectures III: Segmented DACs", Analog Devices MT-016 Tutorial, (2009), 6 pgs.

*Primary Examiner* — Jean B Jeanglaude
(74) *Attorney, Agent, or Firm* — Schwegman Lundberg & Woessner, P.A.

(57) ABSTRACT

A multiple impedance string, multiple output digital-to-analog converter (DAC) circuit that can include a shared coarse resolution DAC, two first fine resolution DACs to receive outputs of the MSB DAC, and a multiplexer to multiplex outputs of the first and second fine resolution DACs to output terminals. The multiplexer can be configured to interchange coupling of the outputs of the first and second fine resolution DACs using one or more MSBs.

25 Claims, 9 Drawing Sheets

(56) References Cited

U.S. PATENT DOCUMENTS

| | | |
|---|---|---|
| 6,914,547 B1 | 7/2005 | Swaroop et al. |
| 7,057,491 B2 | 6/2006 | Dempsey |
| 7,109,904 B2 | 9/2006 | Fotouhi |
| 7,136,002 B2 | 11/2006 | Dempsey et al. |
| 7,339,508 B2 | 3/2008 | Cosgrave et al. |
| 7,501,970 B2 | 3/2009 | Trifonov et al. |
| 8,384,577 B1 * | 2/2013 | Landt ................ H03M 1/68 341/144 |
| 8,456,347 B2 | 6/2013 | Wikner |
| 8,618,968 B2 * | 12/2013 | Currivan ............. H04B 1/10 341/144 |
| 8,912,940 B2 | 12/2014 | Dempsey |
| 9,065,479 B2 | 6/2015 | Dempsey |
| 9,077,376 B2 | 7/2015 | Dempsey |
| 9,100,045 B2 | 8/2015 | Dempsey |
| 9,124,296 B2 | 9/2015 | Dempsey |
| 9,407,178 B2 * | 8/2016 | Yim ............... H02P 21/0089 |
| 9,407,278 B1 * | 8/2016 | Dempsey .............. H03M 1/66 |
| 9,444,487 B1 | 9/2016 | Dempsey |
| 9,583,241 B1 | 2/2017 | Dempsey |
| 2006/0082484 A1 * | 4/2006 | Linder ............... H03M 1/007 341/155 |
| 2006/0263254 A1 | 11/2006 | Lee |
| 2011/0304489 A1 * | 12/2011 | Christer ............ H03M 1/1019 341/118 |
| 2012/0065540 A1 | 3/2012 | Yarden et al. |
| 2012/0182165 A1 * | 7/2012 | Currivan ............. H04B 1/10 341/107 |
| 2013/0102061 A1 | 4/2013 | Coursey et al. |

\* cited by examiner

| | INPUT CODE - MSB, [D2:D0] | MSB DAC - CLOSED SWITCHES (DECODED BY D[3:2]) | LSB DACs - CLOSED SWITCHES (DECODED FROM D[2:0]) |
|---|---|---|---|
| ROW 1 | 0000 | SMT1,SMT2,SMB1,SMB2 | SLT0,SLB0 |
| ROW 2 | 0001 | SMT1,SMT2,SMB1,SMB2 | SLT1,SLB1 |
| ROW 3 | 0010 | SMT1,SMT2,SMB1,SMB2 | SLT2,SLB2 |
| ROW 4 | 0011 | SMT1,SMT2,SMB1,SMB2 | SLT3,SLB3 |
| ROW 5 | 0100 | SMT0,SMT1,SMB0,SMB1 | SLT3,SLB3 |
| ROW 6 | 0101 | SMT0,SMT1,SMB0,SMB1 | SLT2,SLB2 |
| ROW 7 | 0110 | SMT0,SMT1,SMB0,SMB1 | SLT1,SLB1 |
| ROW 8 | 0111 | SMT0,SMT1,SMB0,SMB1 | SLT0,SLB0 |
| ROW 9 | 1000 | SMT0,SMT1,SMB0,SMB1 | SLT0,SLB0 |
| ROW 10 | 1001 | SMT0,SMT1,SMB0,SMB1 | SLT1,SLB1 |
| ROW 11 | 1010 | SMT0,SMT1,SMB0,SMB1 | SLT2,SLB2 |
| ROW 12 | 1011 | SMT0,SMT1,SMB0,SMB1 | SLT3,SLB3 |
| ROW 13 | 1100 | SMT1,SMT2,SMB1,SMB2 | SLT3,SLB3 |
| ROW 14 | 1101 | SMT1,SMT2,SMB1,SMB2 | SLT2,SLB2 |
| ROW 15 | 1110 | SMT1,SMT2,SMB1,SMB2 | SLT1,SLB1 |
| ROW 16 | 1111 | SMT1,SMT2,SMB1,SMB2 | SLT0,SLB0 |

FIG. 7

MULTIPLE STRING, MULTIPLE OUTPUT DIGITAL TO ANALOG CONVERTER

FIELD OF THE DISCLOSURE

This disclosure relates generally to digital to analog converters (DACs), and more particularly but not by way of limitation, to impedance string type DACs.

BACKGROUND

Real-world analog signals such as temperature, pressure, sound, or images are routinely converted to a digital representation that can be easily processed in modern digital systems. In many systems, this digital information is converted back to an analog form to perform some real-world function. The circuits that perform this step are digital-to-analog converters (DACs), and their outputs are used to drive a variety of devices. Loudspeakers, video displays, motors, mechanical servos, sensor actuation, instrumentation, radio frequency (RF) transmitters, and temperature controls are just a few diverse examples. DACs are often incorporated into systems in which real-world signals are digitized by analog-to-digital converters (ADCs), processed, and then converted back to analog form by DACs.

A DAC produces a quantized or discrete step analog output in response to a binary digital input code and the analog output is commonly a voltage or a current. To generate the output, a reference quantity, or level, (usually the aforementioned voltage or current) is commonly divided into binary and/or linear fractions. Segmented converters convert different parts, or segments, of the input in stages e.g. with most significant bits (MSBs) converted by a first stage or sub-block and least significant bits (LSBs) converted by a second stage or sub-block. Converters may also have modes utilising decision tree logic to decode the input and the converter may not be fully segmented, e.g., per U.S. Pat. No. 9,444,487.

Then the digital input drives switches that combine an appropriate number of these fractions to produce the output. The number and size of the fractions reflect the number of possible digital input codes, which is a function of converter resolution or the number of bits (n) in the input code.

SUMMARY OF THE DISCLOSURE

As compared to some single-ended solutions, differential multiple-string impedance digital-to-analog converters (DACs) can provide better signal range and robustness. The present inventors have recognized that one problem to be solved is that multiple output DAC circuitry can occupy significant area of an integrated circuit reducing the area and can include a large number of switches, which can decrease the speed of the DAC and can contribute leakage current. Switch leakage current degrades the DAC linearity performance at higher temperature and thus also reduces the maximum operating temperature range. The present inventors have solved this problem by reducing, e.g., eliminating substantially half of the switches in some DAC circuit approaches, the number of switches in a differential multiple string DAC circuit. The inventors also realized that a multiple output DAC can be performance limited where different sub-parts of the string were coupled together and developed solutions to overcome this limitation.

In some aspects, this disclosure is directed to a multiple string, multiple output digital-to-analog converter (DAC) circuit. The circuit comprises a shared coarse resolution DAC to convert most significant bits (MSBs) of a digital input stream into a first analog signal component and a second analog signal component; a first fine resolution DAC to convert least significant bits (LSBs) of the digital input stream, the first fine resolution DAC having first inputs to receive the first analog signal component from the shared coarse DAC; a second fine resolution DAC to convert the least significant bits (LSBs) of the digital input stream, the second fine resolution DAC having second inputs to receive the second analog signal component from the shared coarse DAC; and a multiplexer to multiplex outputs of the first and second fine resolution DACs to first and second output terminals, the multiplexer configured to interchange coupling of the outputs of the first and second fine resolution DACs using a control signal.

In some aspects, this disclosure is directed to a method of converting a digital input stream to a corresponding first analog output and a second analog output. The method comprises providing: a shared coarse resolution DAC to convert most significant bits (MSBs) of the digital input stream into a first analog signal component and a second analog signal component; a first fine resolution DAC to convert least significant bits (LSBs) of the digital input stream, the first fine resolution DAC having first inputs to receive the first analog signal component from the shared coarse DAC; and a second fine resolution DAC to convert the least significant bits (LSBs) of the digital input stream, the second fine resolution DAC having second inputs to receive the second analog signal component from the shared coarse DAC. The method further comprises controlling, using a control signal, a multiplexer to multiplex the first and second analog outputs of the first and second fine resolution DACs to first and second output terminals of the multiplexer, the multiplexer configured to interchange coupling of the first and second analog outputs.

In some aspects, this disclosure is directed to a differential multiple string digital-to-analog converter (DAC) circuit comprising a shared coarse resolution DAC to convert most significant bits (MSBs) of a digital input stream into a first analog differential signal component and a second analog differential signal component; a first fine resolution DAC to convert least significant bits (LSBs) of the digital input stream, the first fine resolution DAC having first inputs to receive the first analog differential signal component from the shared coarse DAC; a second fine resolution DAC to convert the least significant bits (LSBs) of the digital input stream, the second fine resolution DAC having second inputs to receive the second analog differential signal component from the shared coarse DAC; and a multiplexer to multiplex outputs of the first and second fine resolution DACs to first and second differential output terminals, the multiplexer configured to interchange coupling of the outputs of the first and second fine resolution DACs using at least one MSB.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 7 is a table showing the relationship between the four bit digital words fed to the example DAC of FIG. 6.

Figure 1:
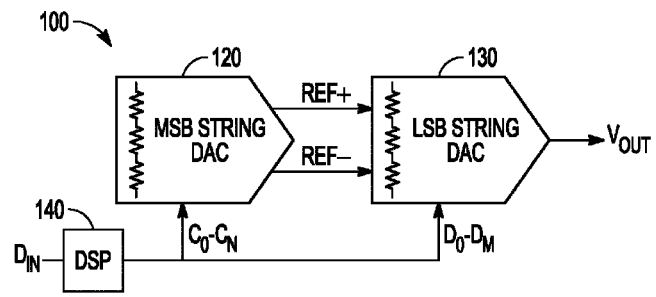
FIG. 1 depicts an example of a dual string digital-to-analog converter.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document describes, among other things, a multiple impedance string, e.g., resistor string, multiple output digital-to-analog converter (DAC) circuit that can include a shared coarse resolution DAC, e.g., an MSB DAC, two first fine resolution DACs, e.g., LSB DACs, to receive outputs of the MSB DAC, and a multiplexer to multiplex outputs of the first and second fine resolution DACs to differential output terminals. The multiplexer can be configured to interchange coupling of the outputs of the first and second fine resolution DACs using one or more MSBs. By multiplexing the outputs of the first and second fine resolution DACs using one or more MSBs of a digital input stream, the present inventors have reduced the area, increased the speed, and reduced the leakage current of a multiple-string, multiple output impedance DAC circuit by reducing, e.g., eliminating half of the switches in some DAC circuit approaches, the number of switches in the DAC circuit. In some example implementations, the multiple string, multiple output DAC circuit can be configured as a differential, multiple string DAC circuit.

FIG. 1 shows a simplified block diagram of a dual string DAC 100. The dual string DAC 100 includes a most significant bits (MSB) String 120 and a least significant bits (LSB) String 130, which both include series-coupled impedance strings, such as resistor strings. A digital signal processor (DSP) 140 receives a digital input signal Din (or digital input stream) and outputs control signals $C_0$-$C_N$ to control the MSB String 120 and control signals $D_0$-$D_M$ to control the LSB String 130. The MSB String 120 typically converts the most significant bits (MSBs) of the digital word, and its output is coupled to the LSB String 130, which converts the least significant bits (LSBs) of the digital word. $V_{OUT}$ represents the converted analog signal.

Figure 2:
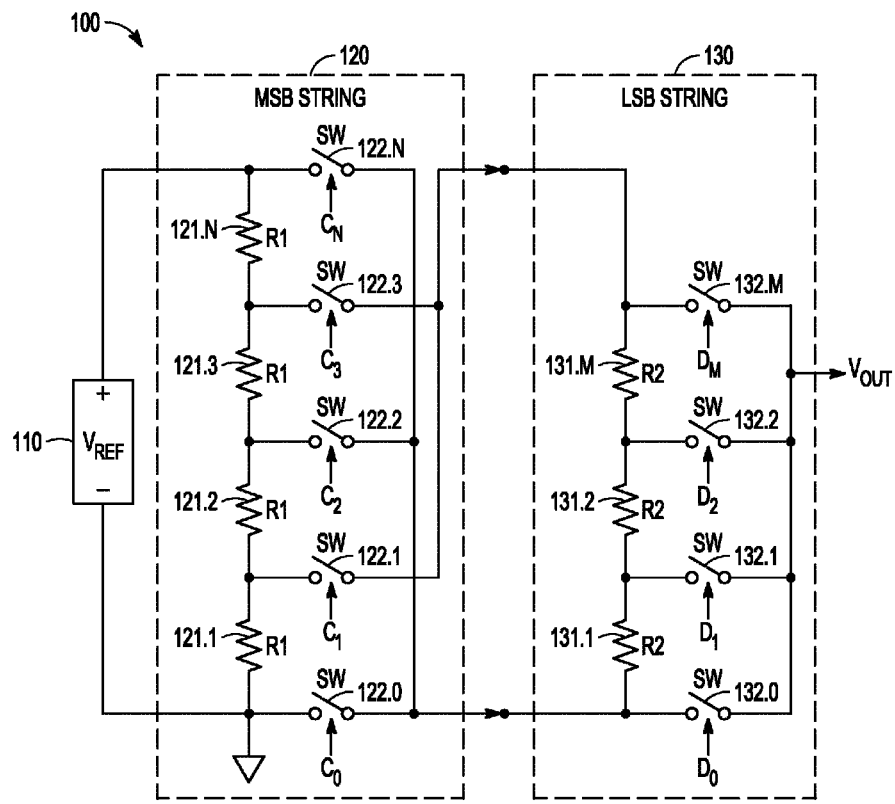
FIG. 2 depicts an example of a schematic diagram of the dual string digital-to-analog converter of FIG. 1.

FIG. 2 depicts an example of a schematic diagram of the dual string digital-to-analog converter 100 of FIG. 1. As shown, each string 120, 130 include a resistor string 121.1-121.N, 131.1-131.M coupled to respective switch sets 122.0-122.N, 132.0-132.M that are operated according to digital word based control signals, $C_0$-$C_N$ and $D_0$-$D_M$. Also, the switches in switch sets 122.0-122.N, 132.0-132.M generally include only two states—on or off. The dual string DAC 100, however, is a single channel DAC. Multiple channel string DACs are disclosed in commonly assigned U.S. Pat. No. 9,124,296, the entire content of which is incorporated herein by reference. Multiple string DACs are disclosed in commonly assigned U.S. Pat. No. 9,100,045, the entire content of which is incorporated herein by reference. Another example of a multiple string DAC that can be used to implement the techniques of this disclosure is disclosed in commonly assigned U.S. Pat. No. 5,969,657, the entire content of which is incorporated herein by reference.

It will be appreciated that a multi-string DAC can also be considered a multi-stage DAC where at least two stages can include a string of impedance elements. In such a multi-string converter, a first stage uses a first string for converting an n-bit digital word, e.g., coarse conversion, and a second stage using a second string to further decode the n-bit digital word, e.g., finer conversion. Within the context of the following, which is provided to assist the person of skill in an understanding of features and benefits of an arrangement in accordance with the present teaching, each of the strings will be described with reference to an exemplary implementation using resistors. It will be appreciated that resistors are an example of the type of impedance element that may be used and it is not intended to limit the present teaching to an implementation where resistors are used exclusively as impedance elements. In this regard it will be appreciated that resistors may be a preferred type of impedance element, particularly in scenarios where the voltage across the string is high—such as the string that is coupled to the reference terminals of the converter. Polysilicon resistors and thin film resistors are integrated resistor types that may be used for low power and precision implementations as these types do not have a diffusion junction diode leakage path. In other strings where the voltage is relatively small, other elements such as active MOS devices may also be used. The present teaching should therefore not be construed as being limited to a multi-resistor string DAC.

Figure 3:
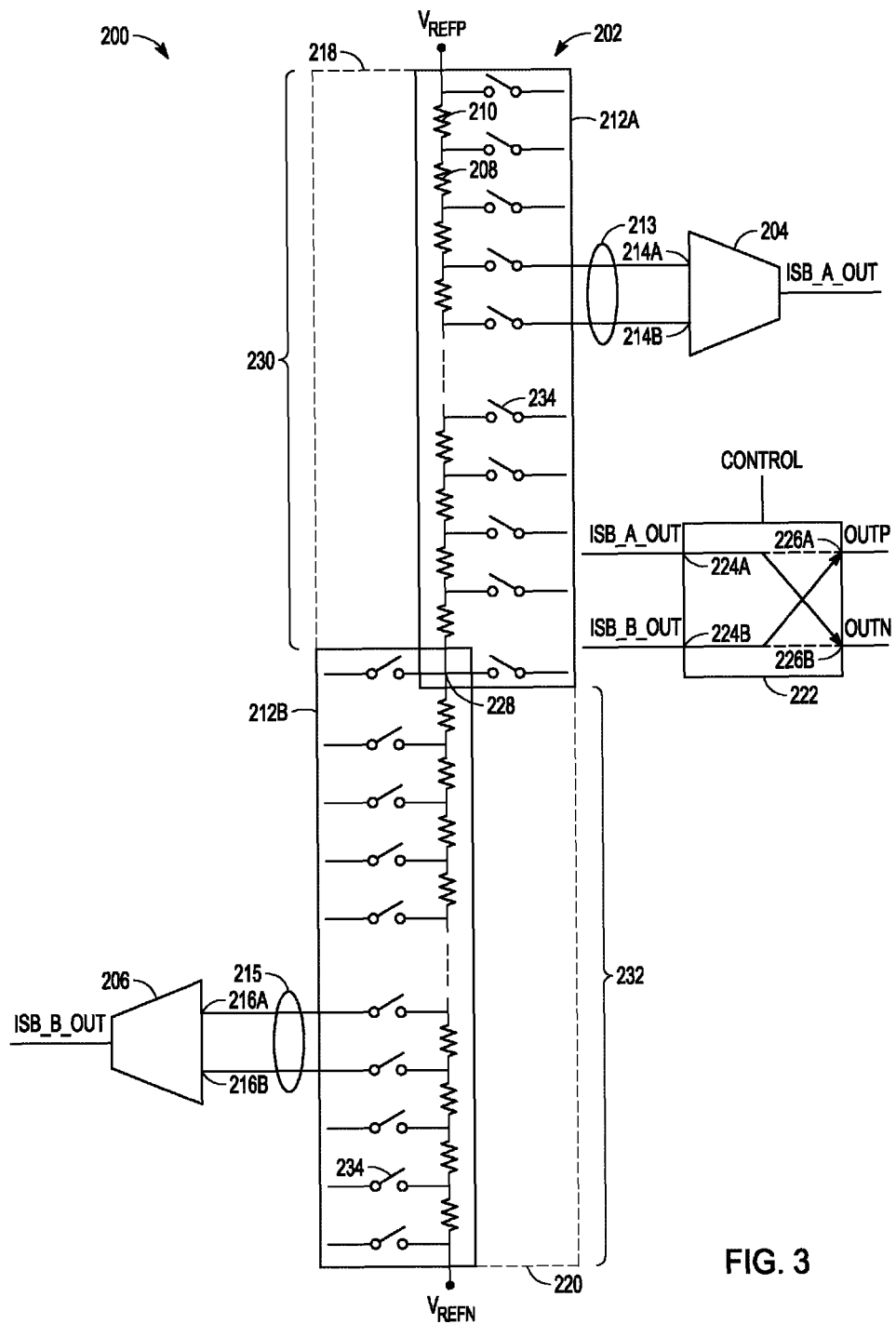
FIG. 3 is a schematic diagram showing an example of a multiple string, multiple output digital to analog converter circuit, in accordance with various techniques of this disclosure.

FIG. 3 is a schematic diagram showing an example of a multiple string, multiple output DAC circuit, in accordance with various techniques of this disclosure. The DAC circuit 200 can include a shared coarse resolution DAC circuit 202, a first fine resolution DAC circuit 204, and a second fine resolution DAC circuit 206. The shared coarse resolution DAC circuit 202 can include a first string 208 of impedance elements 210, the first fine resolution DAC 204 can include a second string of impedance elements (not shown in FIG. 3), and the second fine resolution DAC 206 can include a third string of impedance elements (not shown in FIG. 3). The first fine resolution DAC 204 and the second fine resolution DAC 206 can share the first string. The DACs 204 and 206 work to couple selected nodes from different portions of the first string to their respective fine resolution DAC outputs.

In response to a digital input stream, the shared coarse resolution DAC 202 can convert most significant bits (MSBs) of the digital input stream into a first analog differential signal component 213, e.g., a first voltage produced across a first impedance element(s) 210 of the first string 208, and a second analog differential signal component 215, e.g., a second voltage produced across a second impedance element(s) of the first string 208.

In some examples, the multiple output, e.g., two or more outputs, DAC circuits of this disclosure can be implemented in differential configurations. For example, two outputs can be configured in a differential manner. It should be understood that any descriptions in this disclosure to differential configurations do not exclude the more general multiple output configurations, unless the context makes it clear to the contrary.

The differential DAC circuit 200 of FIG. 3 can further include an MSB switching network 212A, 212B (collectively referred to as switching network 212). In response to the digital input stream, the switching network 212 can couple the first analog differential signal component 213 to inputs 214A, 214B of the first fine resolution DAC 204 to convert least significant bits (LSBs) of the digital input stream and couple the second analog differential signal component 215 to inputs 216A, 216B of the second fine resolution DAC 206 to convert the LSBs.

As mentioned above, the present inventors have dramatically reduced the number of switches in a differential multiple-string impedance DAC circuit. The absence of switches is graphically depicted in FIG. 3 at 218, 220.

In some multiple output DAC circuit approaches, e.g., differential DAC circuits, switches can be included at 218, 220 along at least a portion of the length of the first string 208 and, in some examples, along the entire length of the first string 208. Such an approach can allow both the first fine resolution DAC 204 and the second fine resolution DAC 206 to couple to impedance elements along the length, e.g., from negative reference voltage terminal Vrefn to positive reference voltage terminal Vrefp, of the first string 208 (or "the MSB string"). However, by removing these switches 218, 220, the present inventors have reduced the area, increased the speed, and improved leakage current of the DAC circuit 200.

To accomplish the switch reduction, the present inventors recognized that a multiplexer 222 can be included to interchange coupling of the outputs of the first and second fine resolution DACs using one or more MSBs of the digital input stream. More particularly, the multiplexer 222 can include inputs 224A, 224B to receive the outputs of the first fine resolution DAC 204 and the second fine resolution DAC 206, e.g., outputs lsb_a_out and lsb_b_out. The multiplexer 222 can multiplex the outputs of the first and second fine resolution DACs 204, 206 to first and second differential output terminals 226A, 226B of the multiplexer 222.

The multiplexer 222 can interchange coupling of the first and second fine resolutions DAC outputs using a multiplexer control signal received using a control signal input. In some examples, the multiplexer control signal can be a chopping signal and in other examples, the control signal can one or more MSBs of the digital input stream.

In some examples, the multiplexer control signal can be driven by one or more MSB, a chopping signal, or a digitally gated/decoded/configured version. In some examples, the digital control can be performed along the signal path before driving the multiplexer.

As an example, depending on the control signal, e.g., depending on the MSB(s), the multiplexer 222 can 1) couple the output of the first fine resolution DAC, e.g., output lsb_a_out, to the first differential output terminal "outp" and the output of the second fine resolution DAC, e.g., lsb_b_out, to the second differential output terminal "outn" or 2) couple the output of the first fine resolution DAC, e.g., lsb_a_out, to the second differential output terminal "outn" and the output of the second fine resolution DAC, e.g., lsb_b_out, to the first differential output terminal "outp".

The MSB string, e.g., first string 208, of the multiple string, multiple output DAC circuit 200 has a symmetrical structure around its midpoint node 228 (or at mid-scale). The present inventors have exploited the symmetrical structure to reduce the number of switches needed to operate the DAC circuit.

The operation of a multiple string differential DAC circuit can be explained conceptually with respect to FIG. 3. During their switching operations, the first and second fine resolution DACs 204, 206 can "move" in unison along the first string 208 and as one fine resolution DAC, e.g., the first fine resolution DAC 204, "moves" down the first string 208 in response to a digital input stream, the other fine resolution DAC, e.g., the second fine resolution DAC 206, "moves" up the first string 208.

By multiplexing the outputs of the first and second fine resolution DACs 204, 206 using one or more MSBs of the digital input stream, the present inventors have eliminated the need to include a first switching network extending along the length of the first string 208 through which the first fine resolution DAC 204 can couple to the first string 208 and a second switching network extending along the length of the first string 208 through which the second fine resolution DAC 206 can couple to the first string 208. Because (again, conceptually) the first and second fine resolution DACs 204, 206 can "move" in unison in a complementary manner (e.g., if one moves down, the other moves up) during their switching operations, the present inventors recognized that if the first fine resolution DAC 204 needs to move below a midpoint 228 of the first string 208 in response to the digital input stream, the second fine resolution DAC 206 will be positioned where the first fine resolution DAC 204 needs to move and, similarly, the first fine resolution DAC 204 will be positioned where the second fine resolution DAC 206 needs to move. By multiplexing the outputs of the first and second fine resolution DACs 204, 206, the present inventors have taken advantage of the complimentary positioning of the fine resolution DACs 204, 206 due to the symmetry of the MSB string about the midpoint and thereby eliminated half of the switches, as shown at 212A, 212B, that can be included in some multiple string, multiple output DAC circuit approaches. In this manner, despite the reduction in switches, the first and second fine resolution DACs 204, 206 appear to be going up/down the first string 208 along its length.

As seen in FIG. 3, the first string 208 has a length including a first portion 230 and a second portion 232 and includes a first set of impedance elements 210 along the first portion 230 and a second set of impedance elements 210 along the second portion 232. The DAC circuit 200 can include a switching network having a first set 212A of switching elements 234 and a second set 212B of switching elements 234, where the first set 212A extends along only the first portion 230, and where the second set 212B extends along only the second portion 232. As indicated above, by including switches along only portions of the first string 208, the number of switches in the MSB switching network is substantially reduced, e.g., by half, as compared to other multiple output DAC circuit approaches.

The first fine resolution DAC 204 can include a second string of impedance elements to couple only to the first set of impedance elements 210 using the first set 212A of switching elements and the second fine resolution DAC 206 can include a third string of impedance elements to couple only to the second set of impedance elements using the second set 212B of switching elements.

In this manner, the present inventors have reduced the number of switches needed to operate the differential multiple string DAC circuit 200.

The MSB string in FIG. 3 is depicted as a 6-bit MSB string DAC. In some examples, the first and second fine resolution DACs can be 6-bit LSB string DACs, resulting in a 12-bit differential multiple string DAC. The techniques of this disclosure are not limited to such configurations. Rather, the techniques of this disclosure can be extended to DAC circuits that have more than 12-bit resolution, or less than 12-bit resolution. For purposes of clarity and explanation, an example 4-bit resolution differential multiple string DAC circuit (2-bit MSB string and 2-bit LSB strings) is shown and described in detail with respect to FIG. 6.

As described in detail in commonly assigned U.S. Pat. No. 5,969,657 to Dempsey et al., an impedance string DAC circuit can integrate the impedance of the switches coupled to the MSB string into the transfer function such that the MSB switch impedance causes a step in the transfer function of one LSB when the LSB DAC switches between neighboring MSB resistors. In addition, an LSB string, e.g., the second string, can load the MSB string in a small, repeatable way. This small loading effect can manifest itself as a voltage that is moved about the DAC circuit during switching. The loading effect is essentially constant and can be integrated into the transfer function.

In a differential multiple string DAC, a virtual ground effectively exists at the midpoint node of the MSB string in FIG. 3 and this midpoint node is the only such passive resistor node between 2 MSB impedance elements, and its DC level is substantially un-changed by loading effect changes due to changes in MSB to LSB DAC switching. As such, the voltage level at this node does not move during a mid-scale transition to a first order. The DAC transfer function can utilize the movement of the voltage levels in multi-string DACs without inter-stage voltage buffers or current source/sink active circuitry.

The present inventors have solved the loading effect problem that can exist at the midpoint of the MSB string by modifying the DAC circuit 200 of FIG. 3 around midscale to effect a gain increase and enable moderate on-resistance (Ron) switches to be used in a desirably passive, switched circuit solution. In particular, the present inventors have included an additional impedance element network coupled adjacent to a midpoint node 228 of the MSB impedance string 208. The additional impedance element network is shown at 340 in FIG. 4 and described in detail below.

Figure 4:
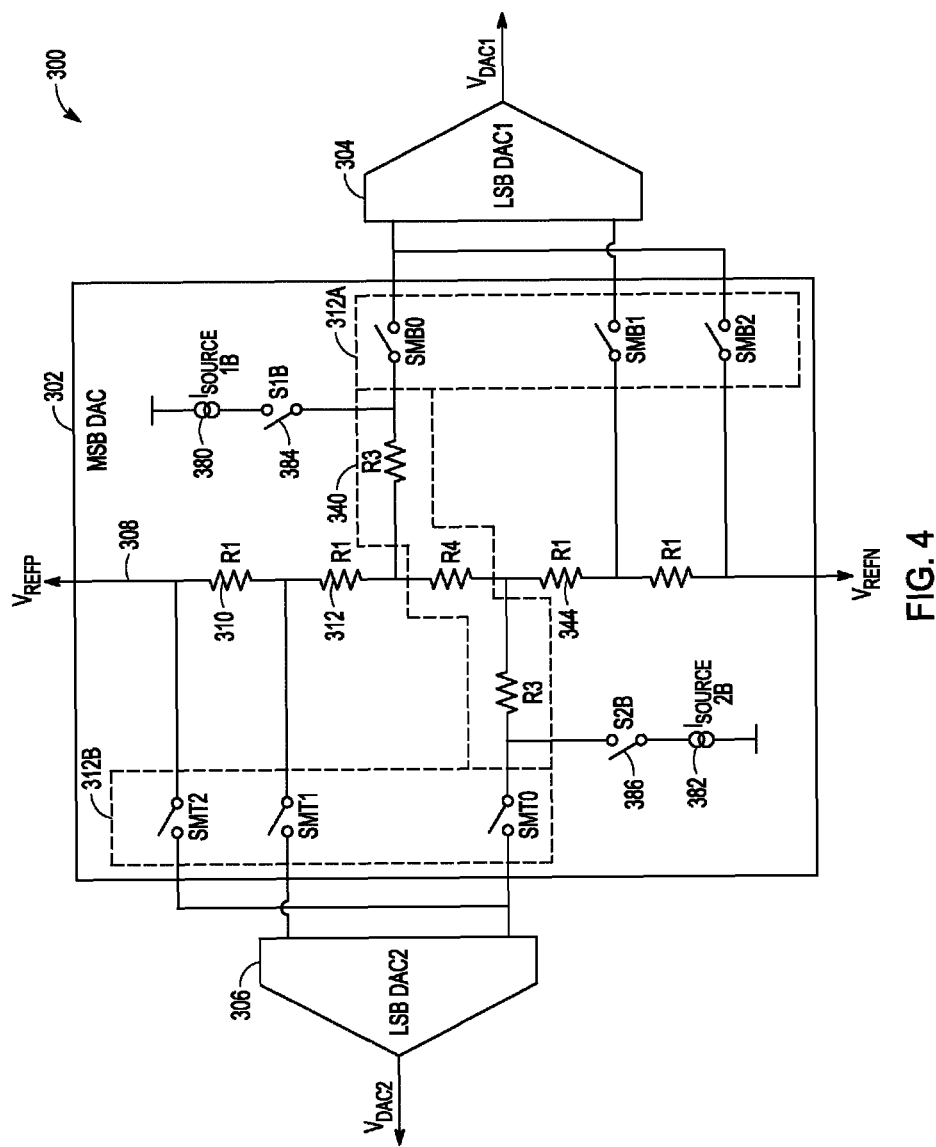
FIG. 4 is a schematic diagram showing an example of a 4-bit multiple string, multiple output DAC circuit, in accordance with various techniques of this disclosure.

FIG. 4 is a schematic diagram showing an example of a 4-bit multiple string, multiple output DAC circuit 300, in accordance with various techniques of this disclosure. The circuit 300 of FIG. 4 is a simplified 4-bit version of the circuit 200 of FIG. 3. The DAC circuit 300 can include a shared coarse resolution DAC circuit 302 (or "MSB DAC"), a first fine resolution DAC circuit 304 (or "LSB DAC1"), and a second fine resolution DAC circuit 306 (or "LSB DAC2"). The first fine resolution DAC circuit 304 and the second fine resolution DAC circuit 306 share the impedance string 308 of the coarse resolution DAC.

For a differential multiple string DAC circuit with n-bit resolution, the MSB string can include M impedance elements 310, e.g., resistors, having an impedance "R1". Although not specifically depicted in FIG. 4 (but shown in FIG. 6), LSB DAC1 304 and LSB DAC2 306 can include impedance elements having resistance "R2". Ideally, each of the R2 resistors of the LSB DACs 304, 306 drops one LSB of voltage.

To solve the loading effect problem mentioned above, the DAC circuit 300 can include impedance elements having resistance "R3" at the MSB switches around the center point of the MSB string, e.g., in series with MSB switches SMB0 and SMT0 in FIG. 4 to create or effect an apparent first string node level change. The relative position of series coupled R3 and SMT0 may be swapped. Similarly, R3 and SMB0 may also be swapped. As a target in this example, the LSB step can desirable equal about two times the voltage across the around the center point of the MSB string as the selected DAC node moves from the bottom of one to the top of the other and visa-versa, in accordance with this disclosure.

In addition, to effect a gain increase and enable high Ron switches, the DAC circuit 300 can include a cross-coupled impedance element network 340 around an impedance element with impedance "R4" in series with the midpoint MSB resistors 342, 344 of the MSB string 308. In order to avoid integral nonlinearity (INL) errors around mid-scale, an impedance "R4" can be chosen that creates a new one LSB loading effect "step" at mid-scale. For example, one LSB of DAC range can correspond to $R4=R1/(2^{n2})$, where n2 is the resolution of the LSB DAC, e.g., the degree of freedom.

By way of a non-limiting specific example for purposes of explanation, for the 4-bit resolution of FIG. 4, with a 2-bit MSB and 2-bit LSB, and if R1=2 kΩ, $R4=2 k\Omega/(2^2)=2000/4=500\Omega$ in the MSB string. However, because of the differential nature of the swap-over at mid-scale, the series impedance needed $R4=(R1/(2^{n2}))/2=2000/8=250\Omega$. It should be noted that the mid-scale transition can also have a 2× contribution from the Ron(combo) of the two mid-scale switches that can be considered.

Due to an interaction between the impedance R4 and each of the impedances R3, the value of R3 can be sized accordingly. For example, R3 can equal (R1)/2+(R2)/4, e.g., R2 divided by 4: one ½ due to ½ LSB change by R4 and ½ due to being a differential solution. Continuing with the example above, R3=2000/2+4000/4=2 kOhms. One LSB of LSB DAC range corresponds to $R4≈R1/2^{n2}=2 k\Omega/32=62.5\Omega$ in the MSB string. For a differential ½ LSB change, an R4 at mid-scale the series impedance of value $R4=R1/2^{n2}/2=2$ k/64=31.25 Ohms may be used.

Inserting the new impedance R4 can increase the gain of the final segment, thereby enabling correction of loading effect induced gain error at midscale to meet the design target. Inserting/increasing impedance R4 can also change the LSB step at midscale, which can cause negative DNL at midscale. Increasing impedance R4 increases the midscale step to reduce the negative DNL magnitude at this node transition. Decreasing impedance R4 can decrease the LSB midscale step, increasing the magnitude of negative DNL.

The interaction between impedance R3 and impedance R4 can be desirable. Impedance R3 can change the LSB step at midscale and the gain error of mid-scale "segments". In addition, impedance R4 can also change the LSB step at midscale and the gain error of mid-scale "segments" (e.g., different gain, different effect with cross-coupling).

The impedance element network 340 in combination with switches SMB0 and SMT0 can be considered a "loading compensation circuit." In some example implementations, the impedances R3 in the impedance element network 340 can be placed on either side (or both sides) of the switches SMB0 and SMT0.

Figure 5:
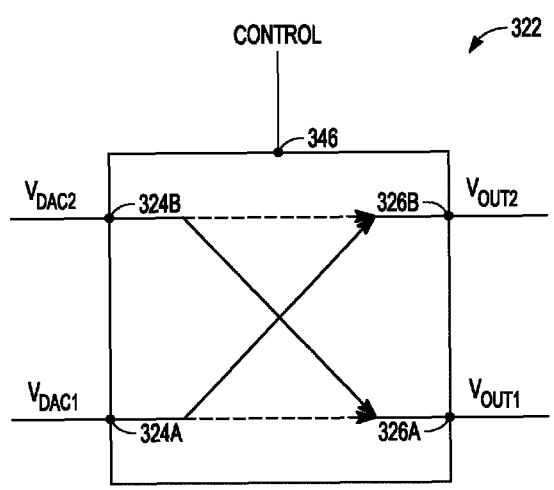
FIG. 5 is a schematic diagram of an example of a multiplexer that can be used to implement various techniques of this disclosure.

As described above with respect to FIG. 3, the output Vdac1 of the LSB DAC1 304 and the output Vdac2 of the LSB DAC2 306 can be received by a multiplexer 322, as shown in FIG. 5. Using one or more MSBs of the digital input stream, the multiplexer of FIG. 5 can interchange coupling of Vdac1 and Vdac2, e.g., the outputs of the LSB DAC1 304, LSB DAC2 306.

That is, depending on the MSB(s), the multiplexer 322 can 1) couple the output of the first fine resolution DAC, e.g., output Vdac1, to the first differential output terminal 326A "Vout1" and the output of the second fine resolution DAC, e.g., output Vdac2, to the second differential output terminal 326B "Vout2" or 2) couple the output of the first fine resolution DAC, e.g., output Vdac1, to the second differential output terminal 326B "Vout2" and the output of the second fine resolution DAC, e.g., output Vdac2, to the first differential output terminal 326A "Vout1".

In addition to the switched passive impedance elements described in this disclosure, active impedance elements can also be used to implement various techniques in this disclosure. In some example implementation the impedance of the active impedance elements can be controlled per the techniques described in commonly assigned U.S. Pat. No. 9,077,376 to Dennis A. Dempsey, the entire contents of which being incorporated herein by reference. It should be noted that it can be desirable to use passive resistive elements in the impedance string as they will not have diode junction leakage paths.

As described above, impedance elements R3 and R4 in the coupling impedance element network portion network 340 can circumvent, or overcome, the AC ground limitation at a terminal between the first and second impedance sections of the string 308 coupled to LSB DAC1 304 and LSB DAC2 306 using switched impedance without requiring active element operation.

As shown in FIG. 4, a switched current source solution can effect a similar DAC voltage change, but a switched current solution can require additional precision active circuitry with additional power, area and operating headroom limitations. Current sources 380, 382 may be coupled to, and de-coupled from the DAC network to effect the required change(s) and such switching may be done with series switches 384, 386, or switching combined within the current source, e.g., a cascode transistor can act as a series switch in the "off" state.

When enabled, the current sources 380, 382 can couple to the DAC network, e.g., to the first string 308, to effect a voltage change to circumvent the loading effect limitation at the midpoint. The current sources 380, 382 can be coupled to the first string multiplexer network between the sub-DAC strings and mid-point. It can be desirable to match the current sources using static and/or dynamic element matching circuit design techniques.

The current sources 380, 382 can be coupled into the DAC network when the first string resistors coupled to the mid-point node are selected and hence these current sources and their associated analog circuitry may be powered off to reduce power consumption when not in use. The current source 382 can also be referred to as a current sink.

In some switched current source solutions, the resistors R3 and R4 in the coupling impedance element network portion network 340 need not be included. In some switched current solutions in which the resistors R3 and R4 in the coupling impedance element network portion network 340 are not included, the current sources 380, 382 can be connected to the right side of the switches SMB0 and SMT0, respectively, instead of the left side as is depicted in FIG. 4. In such a configuration, the current sources 380, 382 can use the on resistance of their associated switches SMB0 and SMT0 to effect voltage change.

FIG. 5 is a schematic diagram of an example of a multiplexer that can be used to implement various techniques of this disclosure. The multiplexer circuit 322 can include one or more inputs 346 to receive a control signal. In some example implementations, the control signal can include one or more MSBs of the digital input stream. In other example implementations, the control signal can include a chopping signal. As described above, the multiplexer 322 can include inputs 324A, 324B to receive the outputs of LSB DAC1 and LSB DAC2 of FIG. 4, namely outputs Vdac1 and Vdac2. The multiplexer 322 can route the outputs Vdac1 and Vdac2 straight through to the first and second differential output terminals 326A, 326B of the multiplexer 322, or interchange the coupling between the inputs 324 and the outputs 326 of the multiplexer 322. This interchange inverts the polarity of DAC differential output signal, swapping the relative position of both outputs.

In some example implementations, the multiplexer circuit 332 can include a clock input (not depicted) to receive a clock signal, and the multiplexer circuit 322 can selectively couple the inputs 324 to the outputs 326 based on the clock signal to chop the analog signal Vdac1 and the analog signal Vdac2. In other example implementations, chopping can be achieved by gating in the control signal path so only one input signal is needed for the multiplexer.

Figure 6:
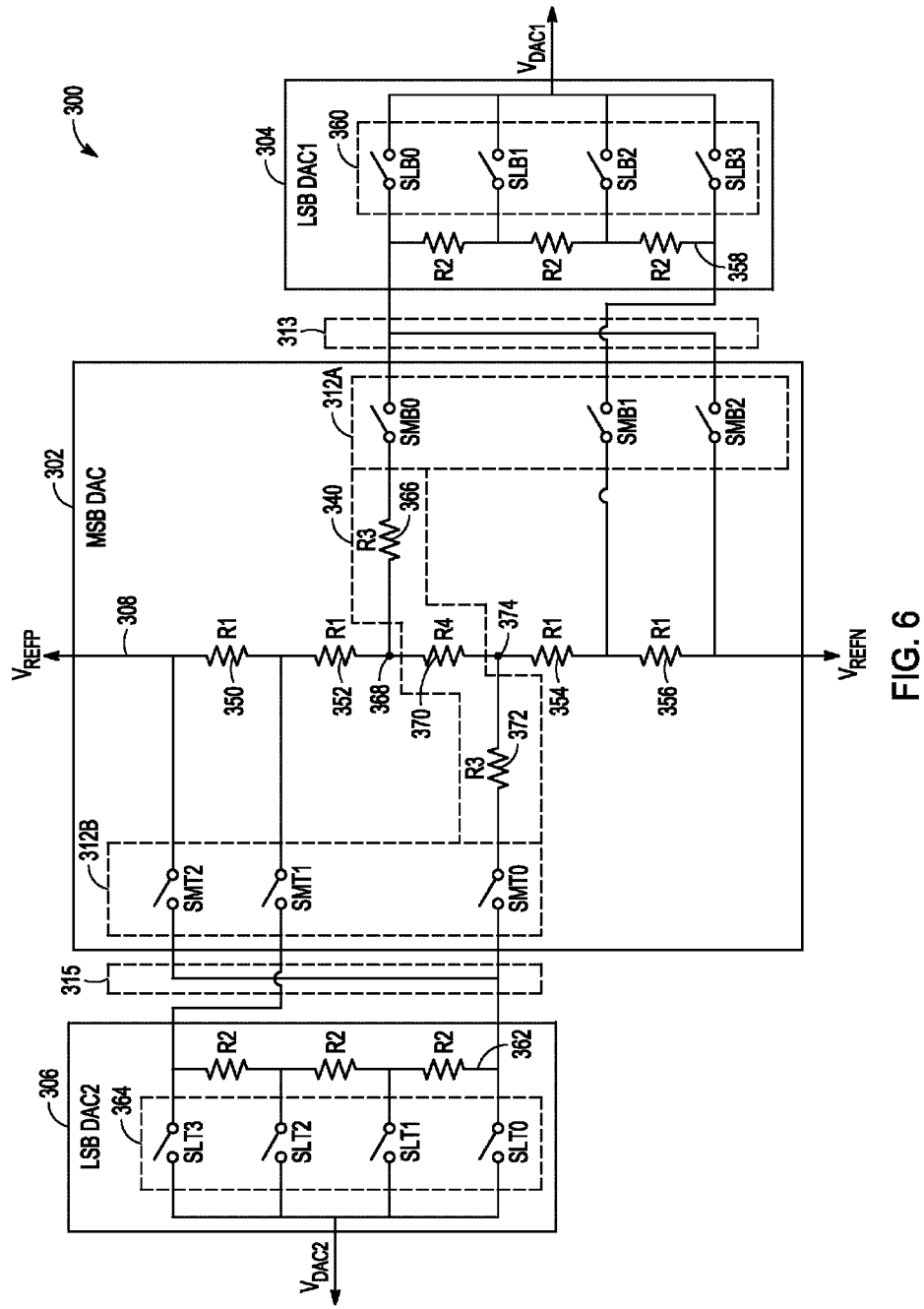
FIG. 6 is a schematic diagram showing an example of a 4-bit multiple string, multiple output DAC circuit, in accordance with various techniques of this disclosure.

FIG. 6 is a schematic diagram showing an example of a 4-bit multiple string, multiple output DAC circuit, in accordance with various techniques of this disclosure. FIG. 6 is similar to FIG. 4 described above but with LSB DAC1 and LSB DAC2 shown in detail. For purposes of clarity and explanation, the differential multiple string DAC circuit 300 of FIG. 6 depicts only 4-bit resolution (2-bit MSB string and 2-bit LSB string). For purposes of conciseness, similar features will not be described in detail again.

MSB DAC 302 can be coarse resolution DAC and can include a string 308 of impedance elements (labeled as having impedance "R1") shared by LSB DAC1 and LSB DAC 2. The MSB string 308 can have a length including a first portion and a second portion, the first string 308 including a first set of impedance elements along the first portion (impedance elements 350 and 352) and a second set of impedance elements along the second portion (impedance elements 354 and 356). The MSB DAC 302 can include a switching network having a first set 312A of switching elements, e.g., switches SMB0-SMB2, and a second set 312B of switching elements, e.g., switches SMT0-SMT2. The MSB DAC 302 can convert the MSBs of the digital input stream into a first analog differential signal component at 313 and a second analog differential signal component at 315.

LSB DAC1 304 can be a fine resolution DAC and can include a string 358 of impedance elements (labeled as having impedance "R2") and a set of switches 360, e.g., switches SLB0-SLB3. LSB DAC1 304, can convert the LSBs of the digital input stream and can have inputs to receive the first analog differential signal component 313 from the MSB DAC.

Similarly, LSB DAC2 306 can be a fine resolution DAC and can include a string 362 of impedance elements (labeled as having impedance "R2") and a set of switches 364, e.g., switches SLT0-SLT3. LSB DAC2 306 can convert the LSBs of the digital input stream and can have inputs to receive the second analog differential signal component 315 from the MSB DAC.

To solve the virtual ground problem described above, the MSB DAC 302 can include a coupling impedance network portion 340. The coupling impedance element network portion 340 can be coupled adjacent to a midpoint node of the MSB string, where the midpoint node is between the two innermost MSB impedance elements 352, 354. The coupling impedance element network portion 340 can include impedance elements having impedance values R3 and R4, as shown in FIG. 6. In some example configurations, the impedance values R3 and R4 can be different from each other and different from the impedance values of the impedance elements of the first string, the second string, and the third string, as described above.

The impedance element having impedance R4 (a "midpoint impedance element") can be coupled between two impedance elements 352, 354 of the MSB string 308 coupled to the midpoint node. In the example shown in FIG. 6, the coupling impedance element network portion 340 can include two impedance elements having impedance R3 (also referred to as "switching impedance elements"). A first switching impedance element 366 having impedance R3 can be coupled to a first terminal 368 of the midpoint impedance element 370 having impedance R4 and coupled to a switching element of the first set 312A of switching elements. Similarly, a second switching impedance element 372 having impedance R3 can be coupled to a second terminal 374 of the midpoint impedance element 370 having impedance R4 and coupled to a switching element of the second set 312B of switching elements.

As mentioned above, rather than utilizing a configuration in which two sets of switches extend along the length of the first string 308, the present inventors have reduced the number of switches in a DAC circuit. As seen in the example configuration shown in FIG. 6, the first set 312A of switching elements extends along only a first portion of the MSB string (impedance elements 354, 356) and the coupling impedance network portion 340, and the second set 312B of switching elements extends along only the second portion of the MSB string (impedance elements 350, 352) and the coupling impedance network portion 340. In addition, the string 358 of LSB DAC1 can couple only to the first set of impedance elements (impedance elements 354, 356) and the coupling impedance network portion 340 using the first set 312A of switching elements. Similarly, the string 362 of LSB DAC2 can couple only to the second set of impedance elements (including impedance elements 350, 352) and the coupling impedance network portion 340 using the second set 312B of switching elements. In this manner, the present inventors have achieved a large reduction, e.g., 50% reduction, in switches of the MSB switching network.

The example configuration shown in FIG. 6 depicts the string 358 of the LSB DAC1 including a number of impedance elements equal to ($2^{n2}-1$), where n2 is the bit resolution of the LSB DAC1 (for completeness, n1 is the bit resolution of the MSB DAC). In the non-limiting example configuration shown in FIG. 6, n2 defines 2 bit resolution, so the number of impedance elements in LSB DAC1 equals $2^2-1=3$ impedance elements, as shown. For a differential multiple string DAC circuit, LSB DAC2 is configured similar to LSB DAC1 and, as such, also includes 3 impedance elements, as shown. An example multiple string DAC circuit having an LSB DAC coupled to an MSB impedance string with ($2^{n2}-1$) LSB DAC impedance elements is described in commonly assigned U.S. Pat. No. 5,969,657 to Dempsey et al., the entire contents of which being incorporated herein by reference.

FIG. 7 is a table showing the relationship between the four bit digital words fed to the example DAC of FIG. 6. The table 400 includes 3 columns, where the left-most column 402 depicts the 4-bit input code, the middle column 404 depicts the closed switches of the MSB DAC, e.g., MSB DAC 302 of FIG. 6, and the right-most column 406 depicts the closed switches of the two LSB DACs, e.g., LSB DAC1 and LSB DAC2 of FIG. 6. The DAC switches which are not listed are configured in an open, or off, condition.

In the example shown in FIG. 7, bit D[3] of the input code can be the MSB used for output swapping control. The MSB DAC switches can be decoded by input code bits D[3:2], and the switches for the two LSB DACs can be decoded by input code bits D[2:0]. The acronyms in FIG. 7 are as follows: SMT=Switch MSB DAC Top; SMB=Switch MSB DAC Bottom; SLT=Switch LSB DAC Top; SLB=Switch LSB DAC Bottom.

The operation of the multiple string, multiple output DAC circuit was explained conceptually with respect to FIG. 3. Conceptually, the LSB DACs can move in unison in a complementary manner (e.g., if one moves down, the other moves up) during switching. The present inventors recognized that if a first LSB DAC needs to move below a midpoint of the MSB string in response to the digital input stream, the second LSB DAC will be positioned where the first LSB DAC needs to move and, similarly, the first LSB DAC will be positioned where the second LSB DAC needs to move.

These techniques are described below using the table of FIG. 7 with respect to the circuit of FIG. 6. Rather than describe the mathematics behind those combinations, some of which are described in detail in U.S. Pat. No. 5,969,657 and incorporated herein by reference, the complimentary "movement" of the two LSB DACs and the coupling interchange using the MSBs, which are among the subjects of this disclosure, will be described with respect to FIG. 7.

In row 1, a digital input stream having an input code of 0000 results in a control circuit, e.g., DSP 140 of FIG. 1, outputting control signals to control the MSB switches SMT1, SMT2, SMB1, and SMB2 to close and outputting LSB switches SLT0 and SLB0 to close. Referring to FIG. 6, it can be seen that this input code, or word, results in the control circuit coupling voltage at terminal Vrefp to the output Vdac2 of LSB DAC2 and coupling voltage at terminal Vrefn to the output Vdac1 of LSB DAC1. Conceptually, using input code 0000 can be considered to couple LSB DAC2 in parallel with uppermost impedance element of the MSB string and LSB DAC1 in parallel with the bottom most impedance element of the MSB string.

Finite on resistance of the switches SMB2 and SMT2 cause DAC zeroscale and fullscale levels to differ from the Vrefn and Vrefp voltage levels, thereby inducing small zeroscale and fullscale errors. The LSB size used for [non-]linearity measurements uses the actual LSB size and end-point adjusts for these end point errors, notable in input code 0000 configuration. The output range is calculated as the fullscale DAC output level minus the DAC output zeroscale level. The actual, or effective, LSB size may be calculated as the DAC output range divided by the number of codes or number of codes minus one.

In row 2, with an input code of 0001, the MSB DAC switches remain per input code 0000 and a one LSB step change is effected by changing the LSB DACs' switching. Similarly, configuration changes in rows 3 and 4 result in further one LSB steps via LSB DACs' switching changes.

In row 5, there is a change vs row 4 switching such that the LSB DACs are flipped in voltage terms and the digital encoder operations of the LSB DAC switches' encoder switching area also flipped from rows 5 through to 8, resulting in one LSB steps at each code.

In this manner, the outputs Vdac1 and Vdac2 move in complimentary manner toward a midpoint. After the midpoint, a multiplexer, e.g., multiplexer 322 of FIG. 5, can interchange coupling of the outputs Vdac1 and Vdac2 of the two LSB DACs. The midpoint can be seen in the switching configurations in FIG. 7. After input code 0111 (row 8), the switching configurations for input codes 1000 through 1111 (rows 9 through 15) are identical to the switching configurations used for input codes 0000 through 0111. Similarly, the switching configurations for input code 0001 in row 2 results in the same switch configurations that were used for the input code 1110 in row 15, the switching configurations for input code 0010 in row 3 results in the same switch configurations that were used for the input code 1101 in row 14, etc.

Lastly, the switching configurations for input code 1111 in row 16 results in the same MSB DAC closed switch configurations (middle column) and LSB DAC closed switch configurations (right-hand column) that were used for the input code 0000 in the first row. Conceptually, using input code 1111 (like input code 0000) can be considered to place LSB DAC2 at the top of the MSB string and LSB DAC1 at the bottom of the MSB string.

Of course, without more, the output Vdac1 of LSB DAC1 and the output Vdac2 of LSB DAC2 for input code 1111 would be the same as for input code 0000. Using a multiplexer, e.g., multiplexer 322 of FIG. 5, to interchange coupling of the outputs Vdac1 and Vdac2 of the two LSB DACs overcomes this scenario. Using one or more MSBs of the input code, the multiplexer can interchange the coupling of the outputs of LSB DAC1 and LSB DAC2 such that the complimentary manner of the two LSB DACs is maintained while eliminating a significant number of switches, e.g., 50% of the switches. For example, for inputs codes 0000-0111 in rows 1-8 in FIG. 7, the multiplexer 322 of FIG. 5 can use the MSB "0" of these inputs codes and can route the outputs Vdac1 and Vdac2 straight through to the first and second differential output terminals 326A, 326B of the multiplexer. For inputs codes 1000-1111 in rows 9-16 in FIG. 7, the multiplexer 322 of FIG. 5 can use the MSB "1" of these input codes and can interchange the coupling between the inputs 324 and the outputs 326 of the multiplexer 322.

Again, by multiplexing the outputs of the two LSB DACs, the present inventors have taken advantage of the complimentary positioning of the fine resolution DACs, e.g., LSB DAC1 and LSB DAC2 of FIG. 6. In this manner, despite the reduction in switches, the first and second fine resolution DACs conceptually appear to be going up/down the MSB string along its length.

Figure 8:
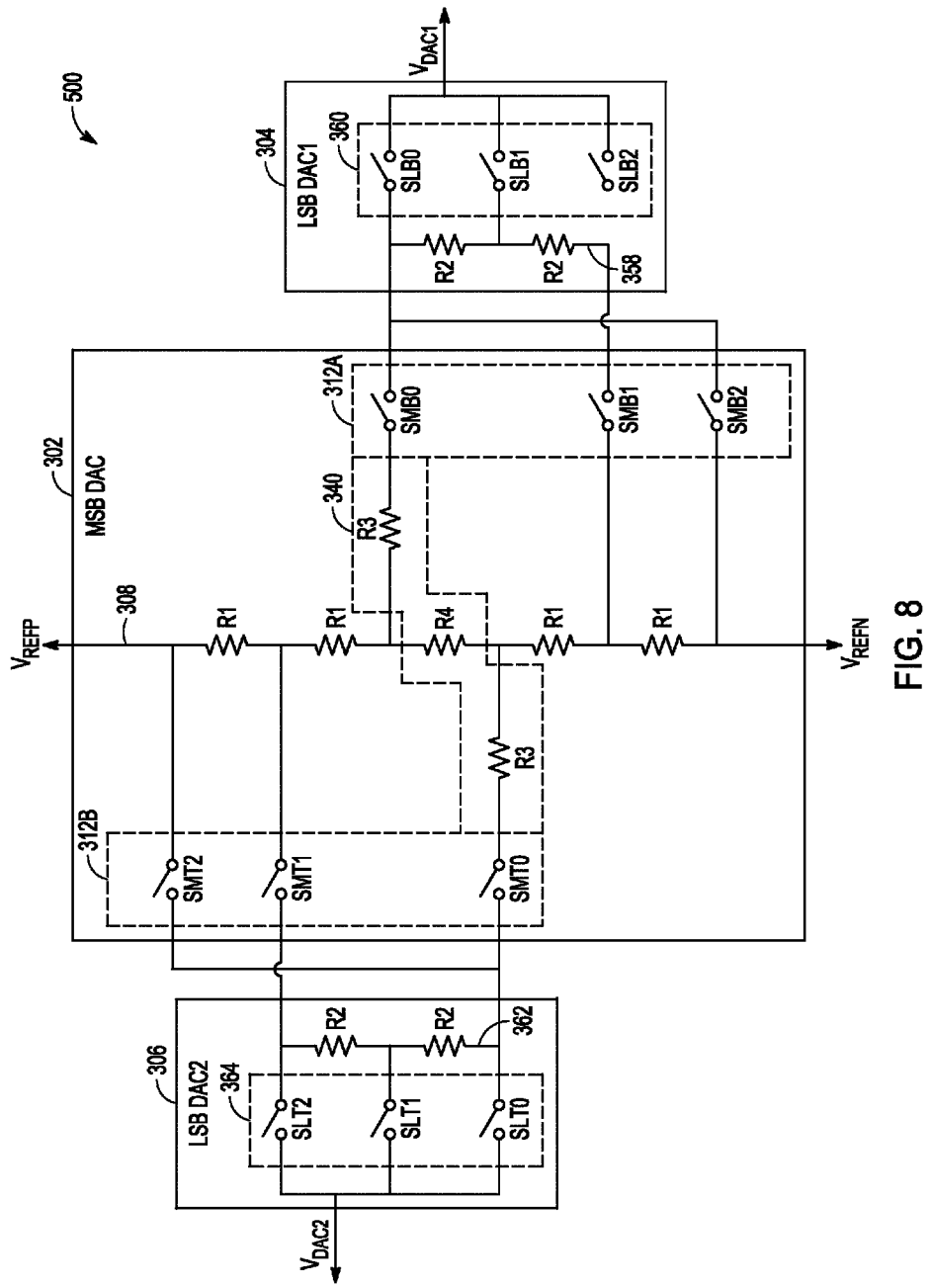
FIG. 8 is a schematic diagram showing another example of a 4-bit multiple string, multiple output DAC circuit, in accordance with various techniques of this disclosure.

FIG. 8 is a schematic diagram showing another example of a 4-bit multiple string, multiple output DAC circuit 500, in accordance with various techniques of this disclosure. Unlike the DAC circuit 300 shown in FIG. 6, the differential multiple string DAC circuit 500 of FIG. 8 depicts the string 358 of the LSB DAC1 including a number of impedance elements (having impedance "R2") equal to $(2^{n2}-2)$, where n2 is the bit resolution of the LSB DAC 1 (for completeness, N1 is the bit resolution of the MSB DAC). In the non-limiting example configuration shown in FIG. 8, n2 define 2 bit resolution, so the number of impedance elements in LSB DAC1 equals $2^2-2=2$ impedance elements, as shown. For a differential multiple string DAC circuit, LSB DAC2 is configured similar to LSB DAC1 and, as such, also includes 2 impedance elements (having impedance "R2"), as shown. An example multiple string DAC circuit having an LSB DAC coupled to an MSB impedance string with $(2^{n2}-2)$ LSB DAC impedance elements is described in commonly assigned U.S. Pat. No. 7,136,002 to Dempsey et al., the entire contents of which being incorporated herein by reference.

Figure 9:
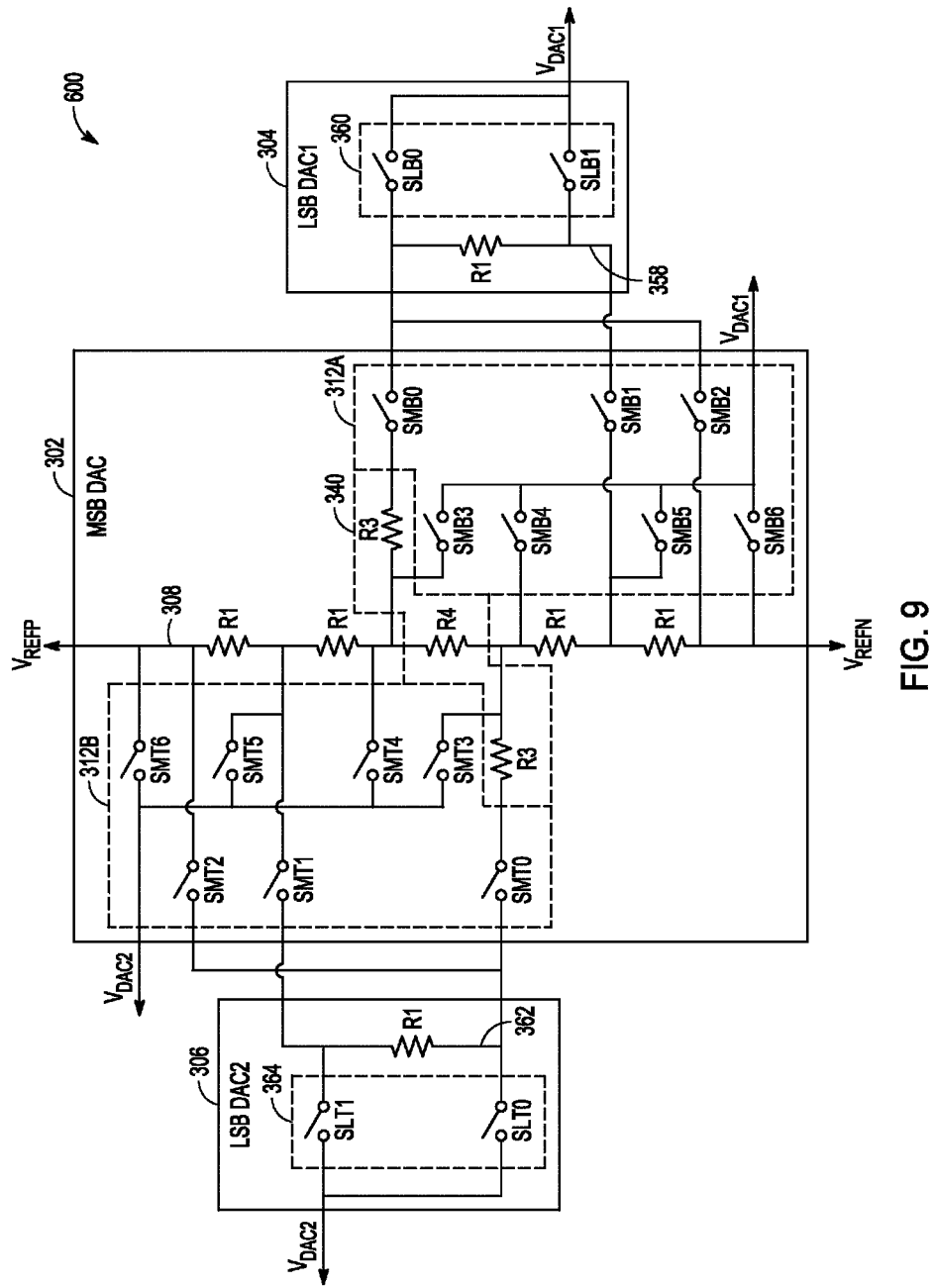
FIG. 9 is a schematic diagram showing another example of a 4-bit multiple string, multiple output DAC circuit, in accordance with various techniques of this disclosure.

FIG. 9 is a schematic diagram showing another example of a 4-bit multiple string, multiple output DAC circuit 600, in accordance with various techniques of this disclosure. Unlike the DAC circuits 300, 500 shown in FIGS. 6 and 8, the differential multiple string DAC circuit 600 of FIG. 9 depicts the string 358 of the LSB DAC1 including a number of impedance elements (having impedance "R1") equal to $(2^{n2}-3)$, where n2 is the bit resolution of the LSB DAC 1 (for completeness, N1 is the bit resolution of the MSB DAC and the n-bit resolution of the DAC=n1+n2). In the non-limiting example configuration shown in FIG. 9, n2=2 bits, so the number of impedance elements in LSB DAC1 equals $2^2-3=1$ impedance elements, as shown. For a differential multiple string DAC circuit, LSB DAC2 is configured similar to LSB DAC1 and, as such, also includes one impedance element (having impedance "R1"), as shown. An example multiple string DAC circuit having an LSB DAC coupled to an MSB impedance string with $(2^{n2}-3)$ LSB DAC impedance elements is described in commonly assigned U.S. Pat. No. 9,065,479 to Dempsey, the entire contents of which being incorporated herein by reference.

In another example, various techniques of this disclosure can be combined with techniques described in U.S. Pat. No. 9,124,296 to Dempsey, the entire contents of which being incorporated herein by reference. For example, FIG. 3 of U.S. Pat. No. 9,124,296 depicts a multi-channel string DAC circuit 300 having a shared MSB string. In some example configurations, each LSB DAC in any of the figures described in this disclosure can be modified using the techniques in U.S. Pat. No. 9,124,296 to produce a multi-channel, multiple output, e.g., differential, DAC circuit with a low switch count. For example, the DAC circuit 300 of FIG. 6 can be modified to include LSB DAC1A and LSB DAC1B and LSB DAC2A and LSB DAC2B, where LSB DAC1A and LSB DAC2A form a multiple output DAC circuit of a first channel and LSB DAC2A and LSB DAC2B form a multiple output DAC circuit of a second channel.

In another example, various techniques of this disclosure can be combined with techniques described in U.S. Pat. No. 9,407,278 to Dempsey, the entire contents of which being incorporated herein by reference. For example, FIG. 1 of U.S. Pat. No. 9,407,278 depicts a multi-stage DAC circuit. In some example configurations, each LSB DAC in any of the figures described in this disclosure can be modified using the techniques in U.S. Pat. No. 9,407,278 to produce a multi-stage multiple-string differential DAC circuit with a reduced number of impedance elements, which can be desirable for higher resolution designs.

In another example, various techniques of this disclosure can be combined with techniques described in U.S. Pat. No. 9,444,487 to Dempsey, the entire contents of which being incorporated herein by reference. For example, FIG. 4 of U.S. Pat. No. 9,444,487 depicts a DAC circuit including variable or tunable load impedances RLOAD that can reduce the impedance of a second LSB string relative to a first MSB string. In some example configurations, DAC circuit in any of the figures described in this disclosure can be modified using the techniques in U.S. Pat. No. 9,444,487 to produce a multi-string differential DAC circuit having tunable load impedance.

Figure 10:
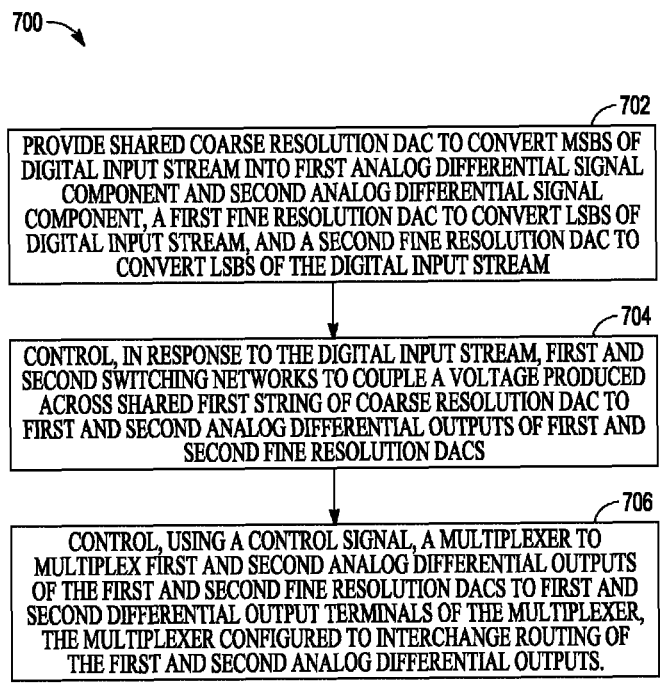
FIG. 10 is an example of a flow diagram of a method of converting a digital input stream to a corresponding first analog output and a second analog output, in accordance with this disclosure.

FIG. 10 is an example of a flow diagram of a method 700 of converting a digital input stream to a corresponding first analog output and a second analog output, in accordance with this disclosure. At block 702, the method 700 can include providing a shared coarse resolution DAC, e.g., MSB DAC 302 of FIG. 6, to convert most significant bits (MSBs) of the digital input stream into a first analog differential signal component and a second analog differential signal component. The method 700 can further include providing a first fine resolution DAC, e.g., LSB DAC1 304 of FIG. 6, to convert least significant bits (LSBs) of the digital input stream, the first fine resolution DAC having first inputs to receive the first analog differential signal component from the shared coarse DAC. The method 700 can further include providing a second fine resolution DAC, e.g., LSB DAC2 306 of FIG. 6, to convert the least significant bits (LSBs) of the digital input stream, the second fine resolution DAC having second inputs to receive the second analog differential signal component from the shared coarse DAC.

At block 704, the method 700 can further include controlling, in response to the digital input stream, first and second switching networks to couple a voltage produced across a shared first impedance string, e.g., string 308 of FIG. 6, of the coarse resolution DAC, to the first and second analog differential outputs of the first and second fine resolution DACs.

At block 706, the method 700 can further include controlling, using a control signal, e.g., a chopping signal or at least one MSB of the digital input stream, a multiplexer to multiplex the first and second analog differential outputs of the first and second fine resolution DACs to first and second differential output terminals of the multiplexer, the multiplexer configured to interchange coupling of the first and second analog differential outputs. For example, the multiplexer 322 of FIG. 5 can include inputs 324A, 324B to receive the first and second analog differential inputs 313, 315 to the first and second fine resolution DACs 304, 306 and can couple the outputs 313, 315 through to the first and second differential output terminals 326A, 326B of the multiplexer 322, or can interchange the coupling of the first and second analog differential outputs.

In some example configurations, the shared coarse resolution DAC can include a first string of impedance elements, the first fine resolution DAC can include a second string of impedance elements, and the second fine resolution DAC can include a third string of impedance elements. The method 700 can optionally include providing a coupling impedance element network portion, e.g., portion 340 of FIG. 6, coupled adjacent to a midpoint node of the first string, where the coupling impedance element network portion includes impedance elements having impedance values different from impedance values of the impedance elements of the first string, the second string, and the third string and controlling, in response to the digital input stream, first and second switching networks to couple a voltage produced across the coupling impedance element network portion to the first and second analog differential outputs of the first and second fine resolution DACs.

In some example configurations, the multiplexer circuit can include a clock input to receive a clock signal, and the method can optionally further include selectively coupling the first and second outputs of the multiplexer circuit based on the clock signal to chop the first analog signal and the second analog signal.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "aspects" or "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, register transfer language (RTL), a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

Example integrated circuit switches include planar FET switches, MOS, CMOS, FinFETs and other non-planar FET variants. In addition, in some example implementations, microelectromechanical system (MEMS) techniques can be used to implement one or more switches of this disclosure. Example techniques are described in commonly assigned U.S. Pat. Nos. 8,102,637; U.S. 8,659,373; U.S. 8,536,964; U.S. 8,294,539; U.S. 8,368,490; U.S. 7,968,364; U.S. 8,279,026; U.S. 7,504,841; U.S. 7,728,610; U.S. 7,737,810; U.S. 7,642,657; U.S. 8,194,382; and U.S. 8,035,148, the entire contents of each being incorporated herein by reference.

Whilst the "digital data stream" term is used to describe the DAC digital input data and may infer a serial data form, it will be appreciated that the DAC digital input data can have other forms, e.g., full parallel word, multiple partial words. It will be appreciated that the DAC input word may be input in many forms or formats for conversion to an analog output signal, and a parallel DAC register is also often used for the digital input to the digital to analog conversion process.

Serially coupled impedance elements have been described as an impedance string and this is also commonly known as an impedance chain. The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A multiple string, multiple output digital-to-analog converter (DAC) circuit comprising:
   a shared first impedance string to convert most significant bits (MSBs) of a digital input stream into a first analog signal component and a second analog signal component;
   a first fine resolution DAC to convert least significant bits (LSBs) of the digital input stream, the first fine resolution DAC having first inputs to receive the first analog signal component from the shared first impedance string; and
   a second fine resolution DAC to convert the least significant bits (LSBs) of the digital input stream, the second fine resolution DAC having second inputs to receive the second analog signal component from the shared first impedance string.

2. The DAC circuit of claim 1, wherein the first fine resolution DAC includes a second string of impedance elements, and wherein second fine resolution DAC includes a third string of impedance elements, the circuit further comprising:
   a coupling impedance element network portion coupled adjacent to a midpoint node of the first string, wherein the coupling impedance element network portion includes impedance elements having impedance values different from impedance values of the impedance elements of the first string, the second string, and the third string.

3. The DAC circuit of claim 2, wherein the coupling impedance element network portion coupled adjacent to a midpoint node of the first string includes:
   a midpoint impedance element coupled between two impedance elements of the first string coupled to the midpoint node;
   a first switching impedance element coupled to a first terminal of the midpoint impedance element and a first switching element of the first set of switching elements; and
   a second switching impedance element coupled to a second terminal of the midpoint impedance element and a first switching element of the second set of switching elements.

4. The DAC circuit of claim 1, the circuit further comprising:
   a loading compensation circuit coupled adjacent to a midpoint node of the first impedance string, wherein the loading compensation circuit includes:
   at least one current source; and
   a switching element to couple the at least one current source to the first impedance string.

5. The DAC circuit of claim 1,
   wherein the first string of impedance elements has a length including a first portion and a second portion, the first string including a first set of impedance elements along the first portion and a second set of impedance elements along the second portion; and
   a coupling impedance network portion, the DAC circuit further comprising:
   a switching network including a first set of switching elements and a second set of switching elements, wherein the first set of switching elements extends along only the first portion and the coupling impedance network portion, and wherein the second set of switching elements extends along only the second portion and the coupling impedance network portion,
   wherein the first fine resolution DAC includes a second string of impedance elements to couple only to the first set of impedance elements and the coupling impedance network portion using the first set of switching elements of a switching network,
   wherein the second fine resolution DAC includes a third string of impedance elements to couple only to the second set of impedance elements and the coupling impedance network portion using the second set of switching elements of a switching network.

6. The DAC circuit of claim 1, wherein the first fine resolution DAC is a first LSB DAC, wherein the second fine resolution DAC is a second LSB DAC, and wherein the first LSB DAC and the second LSB DAC share the first string of impedance elements.

7. The DAC circuit of claim 1,
   wherein each of the first fine resolution DAC and the second fine resolution DAC have n2-bit resolution, wherein the first fine resolution DAC includes a second string of $(2^{n2}-1)$ impedance elements, and wherein the second fine resolution DAC includes a third string of $(2^{n2}-1)$ impedance elements.

8. The DAC circuit of claim 1,
   wherein each of the first fine resolution DAC and the second fine resolution DAC have n2-bit resolution, wherein the first fine resolution DAC includes a second string of $(2^{n2}-2)$ impedance elements, and wherein the second fine resolution DAC includes a third string of ($2^{n2}-2$) impedance elements.

9. The DAC circuit of claim 1,
wherein each of the first fine resolution DAC and the second fine resolution DAC have n2-bit resolution, wherein the first fine resolution DAC includes a second string of ($2^{n2}-3$) impedance elements, and wherein the second fine resolution DAC includes a third string of ($2^{n2}-3$) impedance elements.

10. The DAC circuit of claim 1, further comprising:
a multiplexer to multiplex outputs of the first and second fine resolution DACs to first and second output terminals, the multiplexer configured to interchange coupling of the outputs of the first and second fine resolution DACs using a control signal.

11. The DAC circuit of claim 10,
wherein the control signal includes at least one MSB.

12. A method of converting a digital input stream to a corresponding first analog output and a second analog output, the method comprising:
converting, using a shared first impedance string, most significant bits (MSBs) of the digital input stream into a first analog signal component and a second analog signal component;
receiving, using first inputs of a first fine resolution DAC, the first analog signal component from the shared first impedance string;
converting, using the first fine resolution DAC, least significant bits (LSBs) of the digital input stream;
receiving, using second inputs of a second fine resolution DAC, the second analog signal component from the shared first impedance string; and
converting, using the second fine resolution DAC, the least significant bits (LSBs) of the digital input stream.

13. The method of claim 12, wherein the first fine resolution DAC includes a second string of impedance elements, and wherein second fine resolution DAC includes a third string of impedance elements, the method further comprising:
coupling a coupling impedance element network portion adjacent to a midpoint node of the first string, wherein the coupling impedance element network portion includes impedance elements having impedance values different from impedance values of the impedance elements of the first string, the second string, and the third string; and
in response to the digital input stream, coupling a voltage produced across the coupling impedance element network portion to the first and second analog outputs of the first and second fine resolution DACs.

14. The method of claim 13, wherein coupling a coupling impedance element network portion adjacent to a midpoint node of the first string includes:
coupling a midpoint impedance element between two impedance elements of the first string coupled to the midpoint node;
coupling a first switching impedance element to a first terminal of the midpoint impedance element and a first switching element of the first set of switching elements; and
coupling a second switching impedance element to a second terminal of the midpoint impedance element and a first switching element of the second set of switching elements.

15. The method of claim 12, further comprising:
coupling a coupling impedance element network portion adjacent to a midpoint node of the first impedance string;
coupling a loading compensation circuit adjacent to a midpoint node of the first string, wherein the loading compensation circuit includes at least one current source and a switching element; and
controlling the switching element to couple the at least one current source to the first string.

16. The method of claim 12, wherein the first fine resolution DAC is a first LSB DAC, wherein the second fine resolution DAC is a second LSB DAC, and wherein the first LSB DAC and the second LSB DAC shared the first string of impedance elements, the method comprising:
in response to the digital input stream, coupling a voltage produced across the shared first string to the first and second analog outputs of the first and second LSB DACs.

17. The method of claim 12, wherein each of the first fine resolution DAC and the second fine resolution DAC have n2-bit resolution, wherein the first fine resolution DAC includes a second string of ($2^{n2}-1$) impedance elements, wherein the second fine resolution DAC includes a third string of ($2^{n2}-1$) impedance elements, and wherein the first fine resolution DAC and the second fine resolution DAC share the first string, the method further comprising:
in response to the digital input stream, coupling a voltage produced across the shared first string to the first and second analog outputs of the first and second fine resolution DACs.

18. The method of claim 12, wherein each of the first fine resolution DAC and the second fine resolution DAC have n2-bit resolution, wherein the first fine resolution DAC includes a second string of ($2^{n2}-2$) impedance elements, wherein the second fine resolution DAC includes a third string of ($2^{n2}-2$) impedance elements, and wherein the first fine resolution DAC and the second fine resolution DAC share the first string, the method further comprising:
in response to the digital input stream, coupling a voltage produced across the shared first string to the first and second analog outputs of the first and second fine resolution DACs.

19. The method of claim 12, wherein each of the first fine resolution DAC and the second fine resolution DAC have n2-bit resolution, wherein the first fine resolution DAC includes a second string of ($2^{n2}-3$) impedance elements, wherein the second fine resolution DAC includes a third string of ($2^{n2}-3$) impedance elements, and wherein the first fine resolution DAC and the second fine resolution DAC share the first string, the method further comprising:
in response to the digital input stream, coupling a voltage produced across the shared first string to the first and second analog outputs of the first and second fine resolution DACs.

20. The method of claim 12, further comprising:
multiplexing the first and second analog outputs of the first and second fine resolution DACs to first and second output terminals of the multiplexer to interchange coupling of the first and second analog outputs.

21. The method of claim 20, further comprising:
selectively coupling the first and second outputs based on a control signal to chop the first analog signal and the second analog signal.

22. A differential multiple string digital-to-analog converter (DAC) circuit comprising:
- a shared first impedance string to convert most significant bits (MSBs) of a digital input stream into a first analog differential signal component and a second analog differential signal component;
- a first fine resolution DACs to convert least significant bits (LSBs) of the digital input steam, the first fine resolution DAC having first inputs to receive the first analog differential signal component from the shared first impedance string; and
- a second fine resolution DAC to convert the least significant bits (LSBs) of the digital input stream, the second fine resolution DAC having second inputs to receive the second analog differential signal component from the shared first impedance string.

23. The differential multiple string DAC circuit of claim 22, further comprising:
- a multiplexer to multiplex outputs of the first and second fine resolution DACs to first and second differential output terminals, the multiplexer configured to interchange coupling of the outputs of the first and second fine resolution DACs using at least one MSB.

24. A multiple string, multiple output digital-to-analog converter (DAC) circuit comprising:
- a shared means for converting most significant bits (MSBs) of the digital input stream into a first analog signal component and a second analog signal component;
- a first fine resolution means for converting least significant bits (LSBs) of the digital input stream, the first fine resolution means having first inputs to receive the first analog signal component from the shared means for converting; and
- a second fine resolution means for converting convert the least significant bits (LSBs) of the digital input stream, the second fine resolution DAC having second inputs to receive the second analog signal component from the shared means for converting.

25. The DAC circuit of claim 24, further comprising:
means for multiplexing outputs of the first and second fine resolution means for converting to first and second output terminals, the means for multiplexing configured to interchange coupling of the outputs of the first and second fine resolution DACs using a control signal.

\* \* \* \* \*

UNITED STATES PATENT AND TRADEMARK OFFICE
CERTIFICATE OF CORRECTION

PATENT NO. : 10,075,179 B1
APPLICATION NO. : 15/668088
DATED : September 11, 2018
INVENTOR(S) : Keane et al.

It is certified that error appears in the above-identified patent and that said Letters Patent is hereby corrected as shown below:

In the Claims

In Column 20, Line 6, in Claim 15, after "first", insert --impedance--

In Column 20, Line 10, in Claim 15, after "first", insert --impedance--

In Column 20, Line 14, in Claim 16, delete "shared" and insert --share-- therefor In Column 21, Line 7, in Claim 22, delete "DACs" and insert --DAC-- therefor In Column 21, Line 8, in Claim 22, delete "steam," and insert --stream,-- therefor Signed and Sealed this
Eleventh Day of June, 2019

Andrei Iancu
*Director of the United States Patent and Trademark Office*